United States Patent [19]
Ochi et al.

[11] Patent Number: 5,520,863
[45] Date of Patent: May 28, 1996

[54] METHOD OF MAKING IC CARD

[75] Inventors: Katsunori Ochi, Itami; Syojiro Kodai; Tuguo Kurisu, both of Sanda; Osamu Murakami, Amagasaki; Makoto Kobayashi, Sanda, all of Japan

[73] Assignee: Mitsubishi Denki Kabushiki Kaisha, Tokyo, Japan

[21] Appl. No.: 348,487

[22] Filed: Dec. 2, 1994

Related U.S. Application Data

[62] Division of Ser. No. 121,900, Sep. 16, 1993, Pat. No. 5,416,358.

[30] Foreign Application Priority Data

Sep. 17, 1992 [JP] Japan .................................. 4-248368

[51] Int. Cl.⁶ .................... B29C 44/06; B29C 44/12
[52] U.S. Cl. .................... 264/46.5; 264/46.6; 264/161; 264/272.17; 425/812
[58] Field of Search .................... 264/272.17, 161, 264/46.6, 46.5, 272.11; 425/812

[56] References Cited

U.S. PATENT DOCUMENTS

| | | | |
|---|---|---|---|
| 4,264,917 | 4/1981 | Ugon | 357/74 |
| 4,303,934 | 12/1981 | Stitt | 357/14 |
| 4,592,131 | 6/1986 | Deie | 264/161 |
| 4,803,542 | 2/1989 | Haghiri-Tehrani | 357/72 |
| 4,927,590 | 5/1990 | Poelzing | 264/272.17 |
| 4,960,983 | 10/1990 | Inoue | 235/449 |
| 4,961,893 | 10/1990 | Rose | 264/272.17 |
| 5,102,828 | 4/1992 | Marchisi | 264/272.17 |
| 5,173,841 | 12/1992 | Uenaka et al. | 361/399 |
| 5,184,209 | 2/1993 | Kodai et al. | 257/679 |
| 5,189,638 | 2/1993 | Kimura | 365/52 |
| 5,192,682 | 3/1993 | Kodai et al. | 437/219 |
| 5,210,442 | 5/1993 | Ishimoto | 257/679 |
| 5,346,576 | 9/1994 | Kobayashi et al. | 264/272.17 |

FOREIGN PATENT DOCUMENTS

| | | | |
|---|---|---|---|
| 1093704 | 2/1978 | Canada . | |
| 2665280 | 7/1991 | France . | |
| 2804956 | 8/1978 | Germany | 264/272.17 |
| 2942422 | 10/1979 | Germany . | |
| 3824870 | 7/1988 | Germany . | |
| 60-217492 | 10/1985 | Japan . | |
| 63-198361 | 8/1988 | Japan . | |
| 1-241496 | 9/1989 | Japan . | |
| 2307794 | 12/1990 | Japan . | |
| 414497 | 1/1992 | Japan . | |
| 482799 | 3/1992 | Japan . | |
| 1590158 | 4/1978 | United Kingdom . | |
| 2176936 | 5/1986 | United Kingdom . | |

*Primary Examiner*—Allan R. Kuhns
*Attorney, Agent, or Firm*—Leydig, Voit & Mayer

[57] ABSTRACT

A method for producing an IC card including filling a confined space with a mixture including a foaming resin, the mixture having not been foamed yet, the space being confined by a frame having cut-out portions on inner edges and at least one through-hole passing through the frame in the lateral direction between the inside and the outside of the frame, a circuit board on which functional components are mounted and having edges fitted to one of the cut-out portions of the frame so that the surface of the circuit board on which functional components are mounted faces inward, the frame and the circuit board forming a substantially flat outer surface, and a thin plate having edges fitted to another of the cut-out portions of the frame with the thin plate opposing the circuit board, the frame and the thin plate forming a substantially flat outer surface; foaming the mixture at a predetermined temperature for a predetermined time, thus filling the confined space with foamed resin, and thus making the foamed resin a structural member having mechanical strength, molding the frame, the circuit board, and the thin plate into one body; and removing excess foamed resin from the through-hole in the frame.

1 Claim, 25 Drawing Sheets

METHOD OF MAKING IC CARD

This disclosure is a division of application Ser. No. 08/121,900, filed Sep. 16, 1993 now U.S. Pat. No. 5,416, 358.

BACKGROUND OF THE INVENTION

1. Field of the Invention

The present invention relates to a thin sheet-shaped semiconductor device and a method for producing it. More particularly, the present invention relates to a portable type thin sheet-shaped semiconductor device, such as a non-contact type IC card wherein semiconductor functional components are fully embedded in a resin, and relates to a method for producing it.

2. Description of the Related Art

FIGS. 51 and 52 are a plan view and a side elevational view of a conventional thin sheet-shaped semiconductor device of integral type such as, for example, an IC card (referred to as "IC card" hereinafter). Referring to these figures, functional parts of the IC card such as a packaged IC 3 (referred to as "IC" hereinafter) are mounted on a circuit board 2. The circuit board 2 is surrounded by a frame 7 which is provided on its inner surface with projections (referred to as "ribs" hereinafter) which contact the outer edge of the circuit board 2. The circuit board 2 and the frame 7 are integrated with each other by a forming resin 8 filling the interior of the frame 7, thus realizing an IC card having sufficient strength.

A conventional thin sheet-shaped semiconductor device is typically configured in such a manner described above. This example shown in FIGS. 51 and 52 is a type generally called a non-contact IC card which has no electrical contacts for external interconnections. This type of a thin sheet-shaped semiconductor device is produced as follows. First, functional components such as an IC 3 are mounted on the circuit board 2 such as a lass-filled epoxy printed circuit board. Then, the side of the circuit board 2 on which no components are mounted is covered with a thin plate (surface material) 5 which acts as a case material. Furthermore, the edge portion of the circuit board 2 is pressed against a rib 7a, and the molding resin 8 is filled in the inside of the frame 7 such that the side of the circuit board 2 having the components is covered with the molding resin 8 and such that the thin plate 5, the circuit board 2, and the frame 7 are molded into a single piece with the molding resin 8.

FIGS. 53 and 54 are a plan view and a cross-sectional side view, respectively, of another type of conventional IC card. As shown in these figure, a circuit board 2 on which functional components are mounted is contained in a case 13 made of, for example, plastic. The circuit board 2 is a glass-filled epoxy printed circuit or the like. Functional components such as an IC 3, a battery (not shown) serving as a power source, and other components are mounted on the circuit board 2 wherein these components are connected to an electrical interconnection circuit (not shown) formed on the circuit board 2. The circuit board 2 with these components is placed between a pair of case halves 13a and 13b. These case halves 13a and 13b are bonded to each other. Thus, a complete IC card 1 is obtained.

Then, a design is added to the surface of the exposed side of the thin plate 5 and/or to the surface of the molding resin of the IC card 1. The design is added to the surface of the molding resin after the molding of the resin is complete by printing technology such as silk screen printing or by thermal transfer or by sticking a printed seal such as a tack seal on the surface.

In the thin semiconductor devices described above, it is important to provide representations of the product type, functions, notes, and other designs on the surface of the card. These representations should be clear and beautiful in a sense of art. In the conventional ICs, a design is printed or thermal-transferred on the surface of the molded material, or otherwise a label is stuck on it. When printing or thermal transfer is carried out on such an integrally molded card as shown in FIGS. 51 and 52, applicable methods of printing are limited, because the flatness of the surface of the molding resin is slightly degraded due to thermal shrinkage. This degradation of the flatness occurs because there is local variation in the thickness of the molding resin depending on whether there exists a component embedded inside the molding resin.

On the other hand, in such a thin sheet-shaped semiconductor device as shown in FIGS. 53 and 54, although functional components are contained in a plastic case having flat surfaces, the existence of the free space in the case often introduces deformation in the card itself, which results in the difficulty in printing. In particular, this problem is serious when the printing is performed by means of thermal transfer.

The common problems for both of the above cases are that it is difficult to perform printing on a molded surface due to a problem associated with adhesion properties of printing ink which occurs due to a mold release agent required for the molded resin 8, and that in the case of thermal printing, heat generation during the thermal printing leads to bowing of the IC card 1. In addition, printing must be carried out individually for each IC card 1 having a significantly large thickness, which results in problems associated with productivity.

There are known methods for producing an IC card in which electronic components are embedded in such a manner that there is no free space within the card. One of such methods is disclosed in Japanese Patent Laid-Open No. 63-257694. In this known method, a thin sheet-shaped semiconductor device is produced as follows. As shown in FIG. 55, a module 16 including functional components is set in a mold 22, and a thermoplastic resin is injected into the mold 22 through an injection inlet 23 so as to mold the module 16 with the thermoplastic resin. In this way, a complete IC card is obtained in which the module 16 is embedded in an IC card body in an integral form. In this method of producing an IC card, terminals for external interconnections (not shown) of the module 16 embedded in the IC card are exposed to the outside of the IC card. The module 16 is fixed in a cavity of the mold 22 with a vacuum fixing technique such that terminals for external interconnections are in contact with the inner surface of the mold 22 and; injection-molding is used to obtain a complete IC card.

FIG. 56 shows another method for producing a non-contact type IC card having no terminals for external interconnections, which is disclosed in Japanese Patent Laid-Open No. 1-241496. In this method, a module 16 including a circuit board 2 on which ICs 3 and a battery 24a are mounted is put in a case 24 for a module 16, then a thermosetting resin to be used as a molding resin is injected into the case 24 through holes 24a provided in one side of the case. Then, the molding resin filling the space in the case 24 is heated to be cured. Thus, the case 24 and the module 16 are molded with the molding resin, and a complete IC card in an integral form is obtained. There is no space remaining in the IC card according to this method. As a result, this card has a mechanical strength strong enough for a person to carry it with him/her.

In the above method for producing a thin sheet-shaped semiconductor device, in which after a module 16 is set in a mold 22, a thermoplastic resin is injected around the module 16 in the case of a non-contact card which has no terminals for external connections, the injection molding is not capable of embedding the whole of module 16 in the resin. One surface must be in contact with the mold 22 so as to fix the module 16 to the mold 22, and this is always exposed to the outside as a surface of a complete IC card. Therefore, this method is not suitable. In some cases, electronic components mounted on the module 16 are damaged by the pressure applied during the injection molding. In particular, in the case of an IC card having a battery 4a, the battery 4a is destroyed during the process of injection molding due to high temperature and high pressure. Thus, this production method cannot be used to embed a battery 4a in an integrated form. Furthermore, when a design is added to the IC card, it is required to print the design on the IC card one at a time, or during the molding process the design is transferred onto the IC card from the inner surface of the mold. Otherwise, a printed label is stuck on the IC card. In any case, it is impossible to obtain high productivity.

On the other hand, in the method in which after a module 16 having functional components is put in a case 24, a thermosetting resin is filled in the space in the case 24 and cured by means of heating so as to obtain a card in an integrated form, there is little probability that the functional components installed in the card are damaged, because no pressure is applied during the production process. However, when the resin which has been injected into the case 24 is cured, volume shrinkage occurs due to curing-shrinkage, and internal stress is introduced. Because the amount of shrinkage is proportional to the thickness of the resin, variation occurs in the amount of shrinkage from location to location depending on whether a functional component exists at that location or not. As a result, the case 24 is partly deformed inward, so that it is difficult to obtain a flat surface of the IC card. As for addition of a design to the IC card, there are the same problems as in the technology described above.

SUMMARY OF THE INVENTION

In view of the above, the present invention aims to solve the problems described above.

More specifically, it is an object of the present invention to provide a thin sheet-shaped semiconductor device which has good properties in environmental protection and which is suitable for carrying with a person wherein functional components composing an IC card are fully embedded in an IC card body, and wherein a printed material for use as a card surface can be incorporated into a single body when the card is molded so as to obtain beautiful appearance.

It is another object of the present invention to provide a method for efficiently producing a thin sheet-shaped semiconductor device which is thin and small in size and which has high reliability and a beautiful appearance.

According to one aspect of the present invention there is provided a thin sheet-shaped semiconductor device comprising: a frame having cut-out portions formed on the inner edge portions of the frame and further having at least one through-hole passing through the frame in the lateral direction between the inside and the outside of the frame; a circuit board on which functional components mounted, the edge portions of the circuit board being fitted to one of the cut-out portions of the frame in such a manner that the surface having the functional components faces inward and such a manner that the frame and the circuit board form a substantially flat outer surface; a thin plate, the edges of the thin plate being fitted to the other of the cut-out portions of the frame in such a manner that the thin plate opposes the circuit board and such a manner that the frame and the thin plate form a substantially flat outer surface; and a molding resin filling in the space surrounded by the circuit board, the frame, and the thin plate such that the circuit board, the frame, and the thin plate are molded into one body with the molding resin.

According to another aspect of the present invention there is provided a thin sheet-shaped semiconductor device comprising: a circuit board on which functional components are mounted, a frame surrounding the circuit board, cut-out portions being formed on the inner edge portions of the frame, at least one through-hole which passes through the frame in the lateral direction between the inside and the outside of the frame; thin plates, each thin plate being placed on each side of the frame so that the thin plates cover both sides of the circuit board, the edge of each thin plate being fitted to the corresponding cut-out portion of the frame in such a manner that the thin plate and the frame form a substantially flat outer surface; and a molding resin which is filled in the space surrounded by the frame and the thin plates such that the frame and the thin plates are molded into one body with the molding resin.

According to further another aspect of the present invention there is provided a method for producing a thin sheet-shaped semiconductor device, comprising the steps of: filling a mixture including a foaming resin within a space, the mixture having not been foamed yet, the space being surrounded by a frame having cut-out portions formed on the inner edge portions of the frame and further having at least one through-hole passing through the frame in the lateral direction between the inside and the outside of the frame, a circuit board on which functional components are mounted, edge portions of the circuit board being fitted to one of the cut-out portions of the frame in such a manner that the surface having the functional components faces inward and such a manner that the frame and the circuit board form a substantially flat outer surface, and a thin plate, the edges of the thin plate being fitted to the other of the cut-out portions of the frame in such a manner that the thin plate opposes the circuit board and such a manner that the frame and the thin plate form a substantially flat outer surface; foaming the mixture including the foaming resin at a predetermined temperature and for predetermined time, thus filling the whole of the space with the foamed resin, and thus making the foamed resin itself a structural member having predetermined mechanical strength, and thus molding the frame, the circuit board, and the thin plate into one body; and removing excess foaming resin exhausted through the through-hole formed in the frame.

DESCRIPTION OF THE PREFERRED EMBODIMENTS

Referring to figures, embodiments of the present invention will be described hereinbelow. In these figures, the same or similar elements are denoted by the same reference number.

Figure 1:
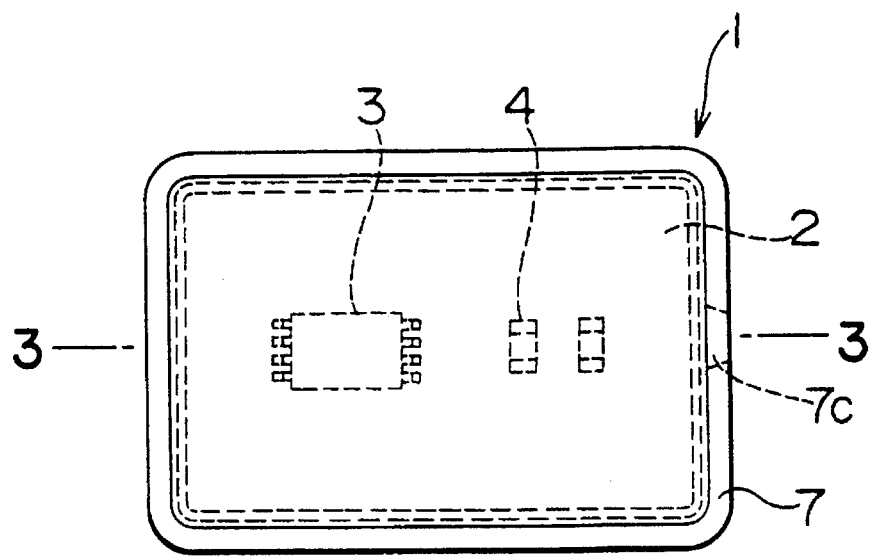
FIG. 1 is a plan view of a thin sheet-shaped semiconductor device in accordance with a first embodiment of the present invention.
Figure 2:
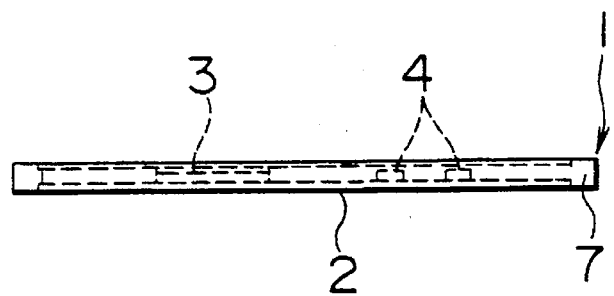
FIG. 2 is a side view of the thin sheet-shaped semiconductor device in accordance with the first embodiment of the present invention.
Figure 3:
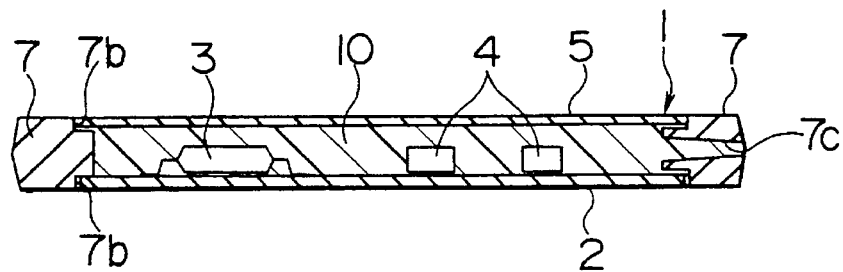
FIG. 3 is an enlarged cross-sectional view of the thin sheet-shaped semiconductor device shown in FIG. 1, taken in the line 1—1 of FIG. 1.

First Embodiment:

FIGS. 1 and 2 are a plan view and a side view, respectively, showing a thin sheet-shaped semiconductor device for portable use, such as an IC card, in accordance with a first embodiment of the present invention. FIG. 3 is an enlarged sectional view taken in the line 3—3 of FIG. 1.

In these figures, an IC card 1 is surrounded by a frame 7 forming side portions of the IC card 1 and a thin plate 5 acting as a surface material. Inside the IC card 1, there is provided a circuit board 2, on the primary surface of which electronic components such as an IC 3, a coil (not shown) and other components are mounted. The term electronic component is herein used to denote a functional component such as IC 3, and a resistor, capacitor, battery used as a power supply, and interconnection circuit (not shown). The back surface of the circuit board 2 opposite to the primary surface having IC 3 and other components forms the other surface of the IC card 1. The electronic components on the circuit board 2 surrounded by the frame 7 are embedded in a molding resin such as a foaming resin. The surface of the IC card 1 is covered with the thin plate 5. The edge portion of the thin plate 5 is fitted to a cut-out portion 7b of the frame 7 which is formed in a stepped shape like a picture frame.

Figure 4:
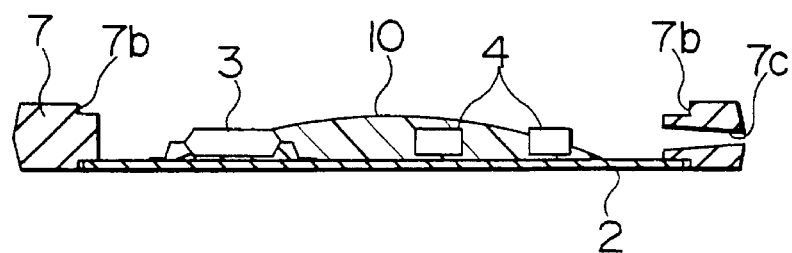
FIG. 4 is a cross-sectional view illustrating a production process of the thin sheet-shaped semiconductor device in accordance with the first embodiment of the present invention.
Figure 5:
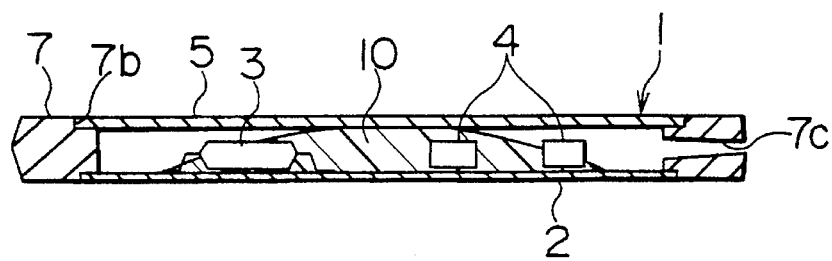
FIG. 5 is a cross-sectional view illustrating a production process of the thin sheet-shaped semiconductor device in accordance with the first embodiment of the present invention.
Figure 6:
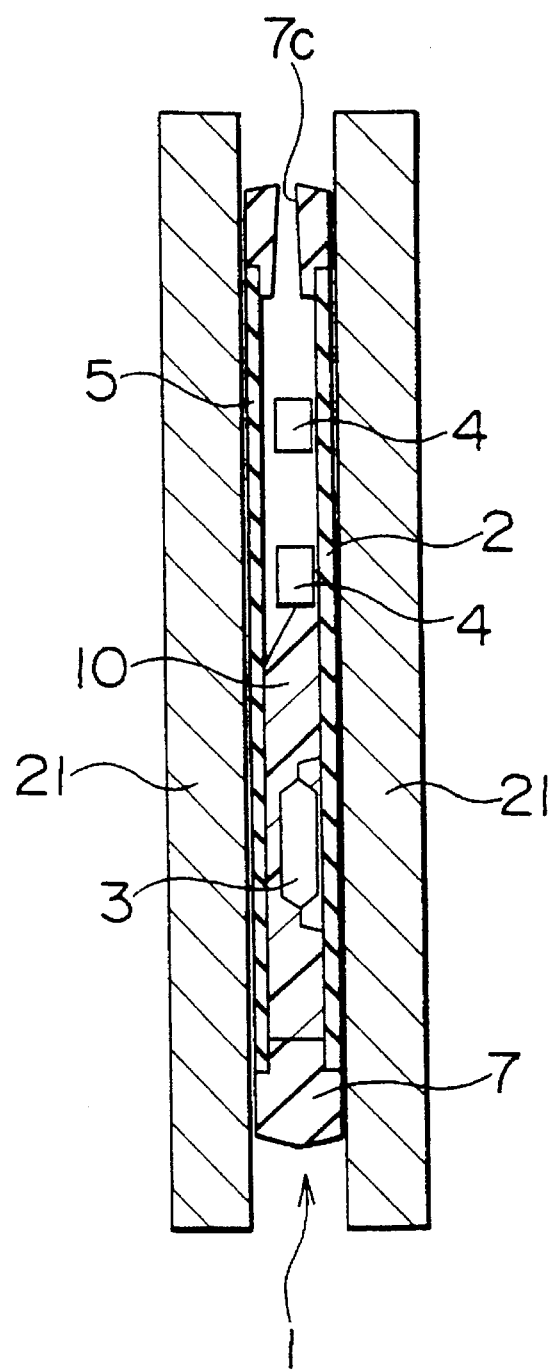
FIG. 6 is a cross-sectional view illustrating a production process of the thin sheet-shaped semiconductor device in accordance with the first embodiment of the present invention.
Figure 7:
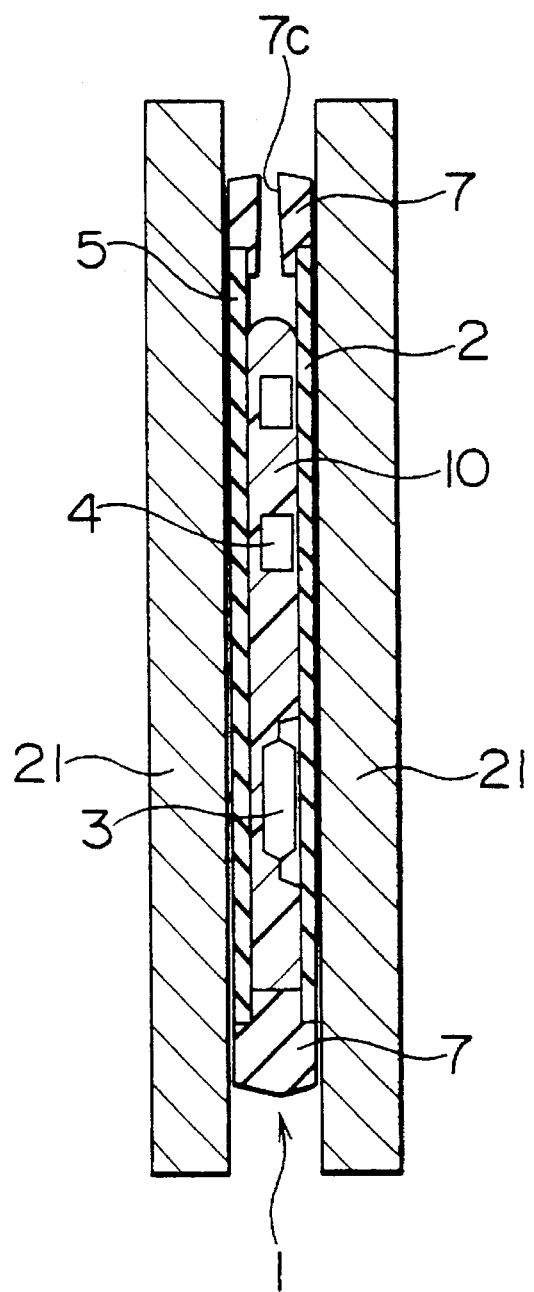
FIG. 7 is a cross-sectional view illustrating a production process of the thin sheet-shaped semiconductor device in accordance with the first embodiment of the present invention.
Figure 8:
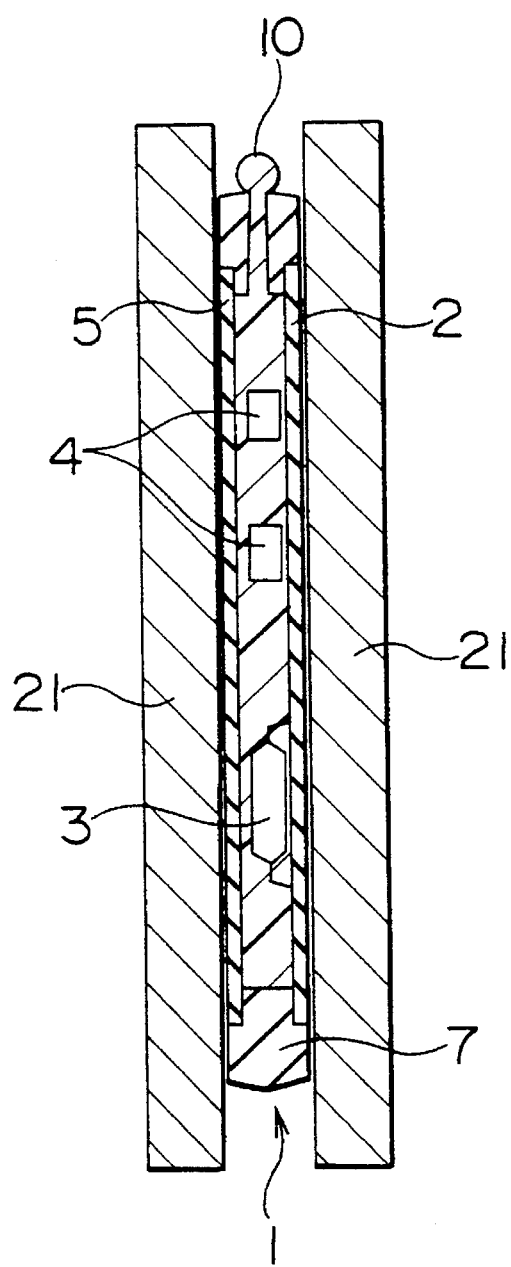
FIG. 8 is a cross-sectional view illustrating a production process of the thin sheet-shaped semiconductor device in accordance with the first embodiment of the present invention.

An IC card 1 having such a configuration described above may be produced according to a procedure shown in FIGS. 4–6. First, as shown in FIG. 4, a circuit board 2 on which an IC 8 and other components 4 are mounted is fitted in the cut-out portion 7b formed on one side of the frame 7. In this state, a predetermined amount of foaming resin 10 which has not been foamed yet is put in the central portion of the circuit board 2. Then, a thin plate 5 is fitted in the cut-out portion 7b formed on the other side of the frame 7. There is provided a path, for example a through-hole 7c, passing through the frame 7 in the lateral direction between the inside and the outside of the frame. Then, as shown in FIG. 6, the assembly is aligned with the vertical direction in such a manner that the through-hole 7c is up, and both sides of the IC card 1 are fixed with a mold 21.

In this state, the mold 21 is heated so as to foam the foaming resin 10. Foaming of the foaming resin 10 occurs in the order as shown in Figures from 6 to 8. As a result of foaming, the foaming resin 10 expands and pushes out the air from inside the mold 21 and finally fills the whole of the inside of the IC card 1. The excess portion of the foaming resin 10 is exhausted from the frame 7 through the through-hole 7c formed in the frame 7, and the resin 10 is cured in this state. In this way, the foaming resin 10 is cured and structural members having predetermined desired mechanical strength are formed. After that, the mold 21 is removed and the portion of the foaming resin 10 which overflowed through the through-hole 7 of the frame 7 is removed. Then, a design sheet is stuck on the exposed surface of the circuit board 2. Thus, a complete IC card 1 is obtained.

In this first embodiment, preferably, the frame 7 may be made of molded ABS resin and the circuit board 2 may be a glass-filled epoxy printed circuit board. The thin plate 5 is preferably a surface-activated PET sheet having a thickness of 250 microns, wherein silk screen printing has been performed on the surface of the sheet to be exposed. The foaming resin 10 is preferably a mixture of 3 components including a main agent of an epoxy resin filled with inorganic material, a curing agent, and a foaming agent. When this foaming resin 10 is used, these three different agents are mixed into one solution at a ratio of 100:20:1, and foaming and curing are performed at 50° C. In this case, resultant foamed and cured resin includes voids of about 50% of the total volume. Therefore, a preferable amount of the starting mixture material in the IC card is 60% of the volume of the space to be filled with the foamed resin 10.

Figure 9:
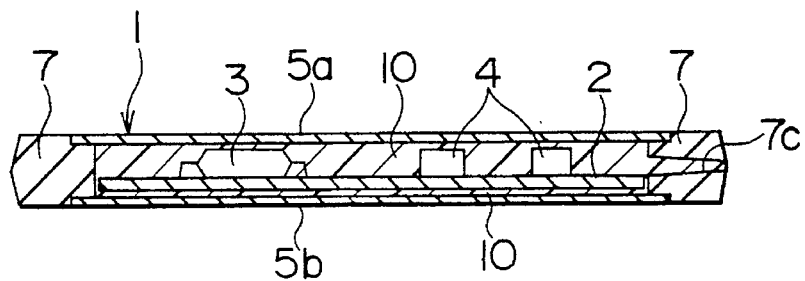
FIG. 9 is a cross-sectional side view of a thin sheet-shaped semiconductor device in accordance with a second embodiment of the present invention.
Figure 10:
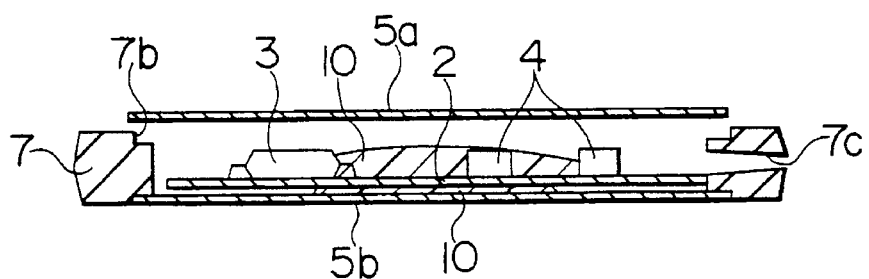
FIG. 10 is a cross-sectional view illustrating a production process of the thin sheet-shaped semiconductor device in accordance with the second embodiment of the present invention.

Second Embodiment:

FIG. 9 is a cross-sectional side view of a thin sheet-shaped semiconductor device, for example an IC card, in accordance with a second embodiment of the present invention. FIG. 10 is a cross-sectional view illustrating a production process. The configuration and the production method of an IC card in accordance with the second embodiment are the same as in the first embodiment except that while in the first embodiment the surface of the circuit board 2 having no functional device is exposed and contacting tests are possible after the foaming resin 10 is molded, in the second embodiment, in contrast, another thin plate 5b exists on the back side of the circuit board 2 such that the thin plate 5b fits to a cut-out portion 7b of the frame 7 and such that the circuit board 2 is in a movable state within the frame 7.

A foaming resin 10 is added as follows. As shown in FIG. 10, the thin plate 5b is fitted onto one side of the frame 7, then a part of amount of the foaming resin 10 which is made by mixing predetermined solutions at a predetermined ratio, is put on the thin plate 5. Furthermore, the circuit board 2 is put on this foaming resin 10, then the remaining amount of foaming resin 10 is put on it. Another thin plate 5a is fitted onto the other cut-out portion 7b of the frame 7, and the assembly is fixed in a mold 21. After that, a complete IC card 1 is produced according to the same procedure as in the case of the first embodiment described above, e.g., foaming and curing the resin.

Figure 11:
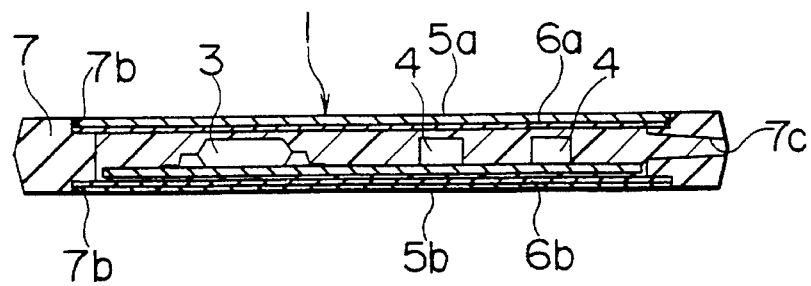
FIG. 11 is a cross-sectional side view of a thin sheet-shaped semiconductor device in accordance with a third embodiment of the present invention.
Figure 12:
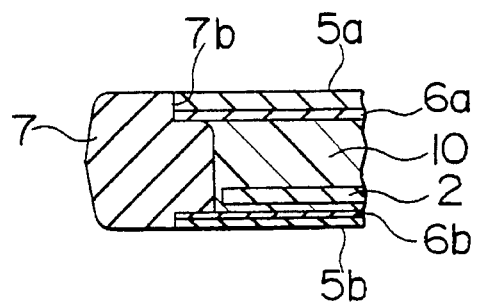
FIG. 12 is an enlarged fragmental cross-sectional view of the thin sheet-shaped semiconductor device in accordance with the third embodiment of the present invention.

Third Embodiment:

FIGS. 11 and 12 are a cross-sectional side view and an enlarged fragmentary cross-sectional view, respectively, showing a thin sheet-shaped semiconductor device, such as an IC card, in accordance with a third embodiment of the present invention. The configuration and the production method of an IC card in accordance with the third embodiment are the same as in the first and second embodiments except that in this third embodiment, adhesive layers 6a and 6b are provided on the inner sides of thin plates 5a and 5b as shown in FIGS. 11 and 12, while in the first and second embodiments a surface-activated PET sheet is used as the thin plate 5. As a result of this, even if the thin plates 5a and 5b are not surface-activated, it is possible to obtain good adhesion to the foaming resin 10. Thus, when the assembly is integrated into one body with the foaming resin 10, good adhesion can be obtained between the foaming resin 10 and the thin plates 5a and 5b.

In this third embodiment, a preferable material for the thin plates 5a and 5b is a 200 μm thick transparent sheet of rigid PVC (poly vinyl chloride). A design is printed on the back side on the transparent sheet of rigid PVC. A 50 μm thick acrylic-resin based pressure-sensitive adhesive tape is transferred onto the printed surface of the transparent sheet of rigid PVC. After that, the thin plates 5a and 5b are fitted to the cut-out portions 7b of the frame 7 in such a manner that the adhesive layers 6a are in contact with the frame 7. As a matter of course, before the thin plate 5a is fitted to the frame 7, the circuit board 2 on which functional components are mounted and a predetermined amount of resin 10 which has not been foamed yet are put on the predetermined location. In this state, the assembly is fixed in the mold 21, and the resin 10 is foamed and cured. The mixing rate of the resin is preferably the same as in the first embodiment. The resin may be preferably cured in the same manner as in the first embodiment.

Figure 13:
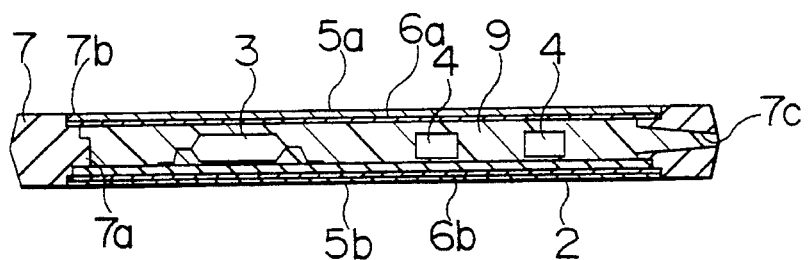
FIG. 13 is a cross-sectional side view of a thin sheet-shaped semiconductor device in accordance with a fourth embodiment of the present invention.
Figure 14:
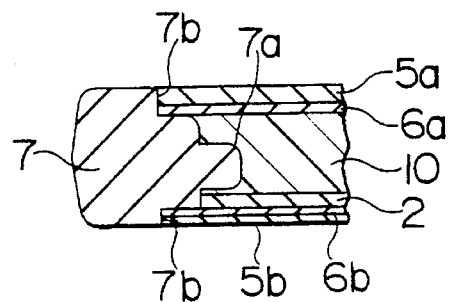
FIG. 14 is an enlarged fragmental cross-sectional view of the thin sheet-shaped semiconductor device in accordance with the fourth embodiment of the present invention.

Fourth Embodiment:

FIGS. 13 and 14 are a cross-sectional side view and an enlarged fragmentary cross-sectional view, respectively, showing a thin sheet-shaped semiconductor device such as an IC card in accordance with a fourth embodiment of the present invention. In the IC card 1 in accordance with the fourth embodiment, a circuit board 2 is attached to a frame 7 such that the electronic components mounted on the circuit board 2 are put at inner locations and such that the edge portion of the circuit board 2 is fitted to the rib 7a of the frame 7. The back surface of the circuit board 2 is covered with a thin plate 5b coated with an adhesive layer is coated. A thin plate 5a coated with an adhesive layer is fitted to the other cut-out portion 7b of the frame 7. Thermoplastic resin 9 is injected to fill the space around the functional components 4, molding the assembly into an integrated unitary body.

Figure 15:
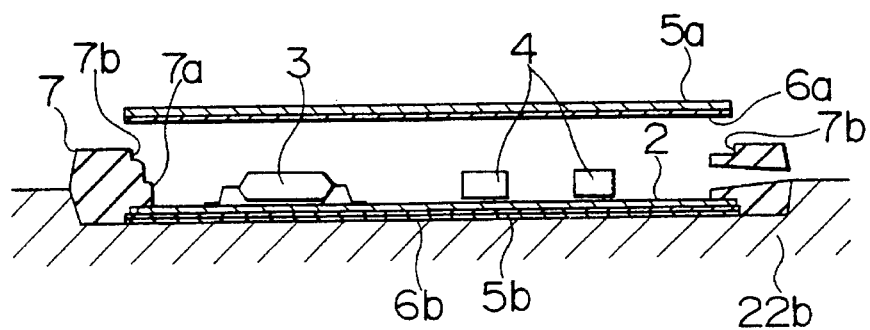
FIG. 15 is a cross-sectional view illustrating a production process of the thin sheet-shaped semiconductor device in accordance with the fourth embodiment of the present invention.
Figure 16:
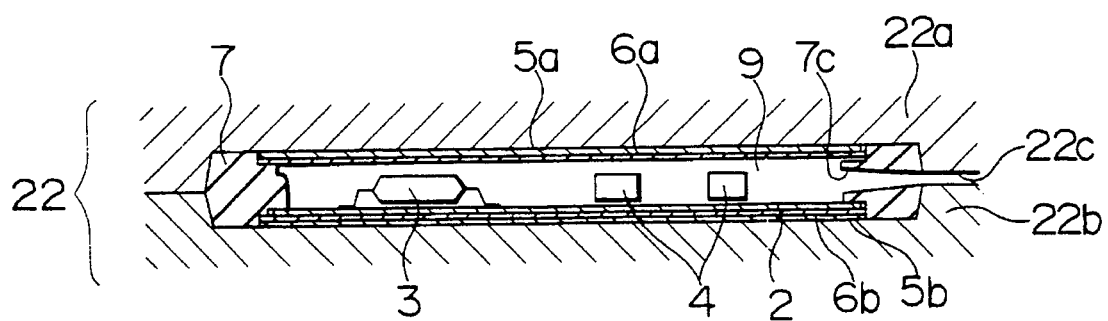
FIG. 16 is a cross-sectional view illustrating a production process of the thin sheet-shaped semiconductor device in accordance with the fourth embodiment of the present invention.

The IC card 1 in accordance with the fourth embodiment may be produced according to a procedure shown FIGS. 15 and 16. First, a frame 7 is made by means of injection molding with a liquid crystal polymer of type II such that the frame 7 has a rib 7a which is to be in contact with and to overlap the periphery of a circuit board 2 and such that the frame 7 has cut-out portions 7b to receive thin plates 5a and 5b. Then, the circuit board 2 on which functional components are mounted is fit to the frame 7 such that the side of the circuit board 2 having the functional components faces inward. Furthermore, the thin plate 5 is fitted to the frame such that the circuit board 2 is covered with the thin plate 5. Then, these members are set in the lower mold half 22b of a mold 22. If it is confirmed that these are set correctly, then the other thin plate 5a coated with an adhesive is fitted to the cut-out portion 7b such that the surface of the thin plate 5a having the adhesive layer faces downward. In this state, all these members are clamped with the upper mold 22a as shown in FIG. 16. A gate 22c is provided in the mold 22 such that the location of the gate 22c corresponds to the location of the through-hole 7c of the frame 7. Then, a liquid crystal polymer of type II used as a thermoplastic resin 9 is injected so as to obtain a complete product molded into a single body.

In this fourth embodiment, a preferable adhesive material for coating the thin plates 5a and 5b is a layer of pressure-sensitive adhesive 6a or 6b. The thin plates 5a and 5b are preferably a 180-μm thick white PET sheet, on one surface of which silk screen printing is performed with UV ink, and onto the other surface of which a 30-μm thick layer of polyolefin based hot melt adhesive is applied to form an adhesive layer 6b. When the molding process using the liquid crystal polymer is carried out, a high temperature and pressure are introduced by the liquid crystal polymer itself and strong bonding is accomplished between the liquid crystal polymer and the thin plates 5a and 5b with the adhesive layer coatings 6a and 6b on the inner surface of the thin plates 5a and 5b.

Figure 17:
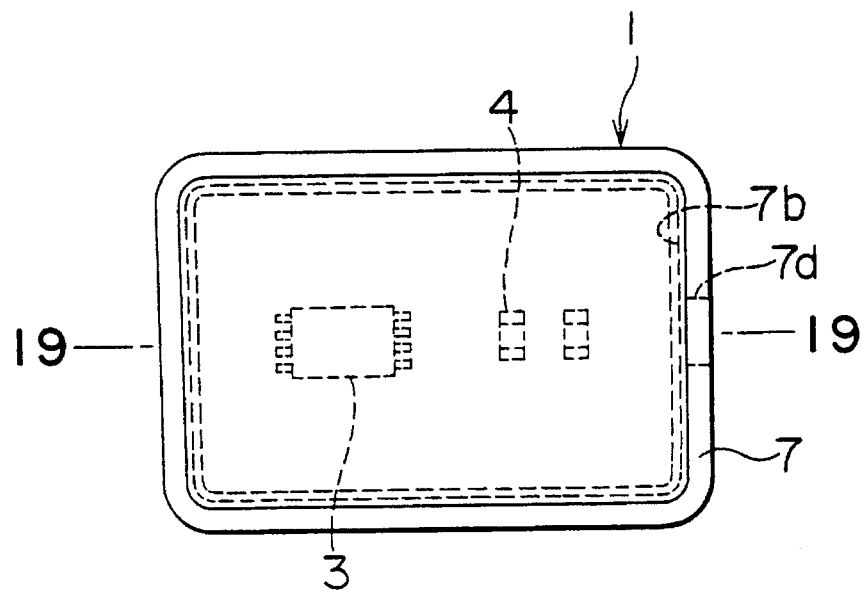
FIG. 17 is a plan view of a thin sheet-shaped semiconductor device in accordance with a fifth embodiment of the present invention.
Figure 18:
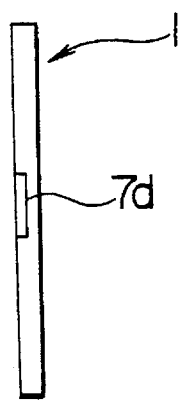
FIG. 18 is a side view of the thin sheet-shaped semiconductor device in accordance with the fifth embodiment of the present invention.
Figure 19:
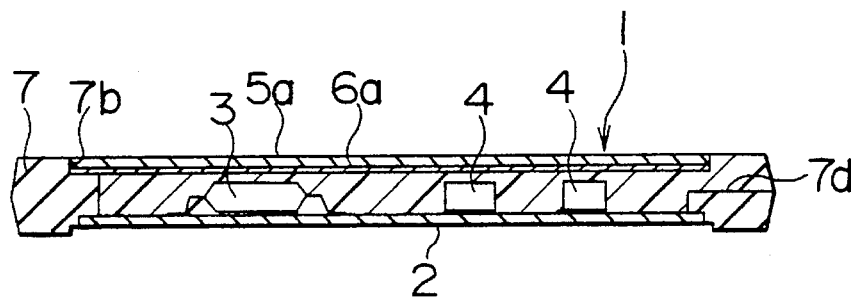
FIG. 19 is an enlarged cross-sectional view of the thin sheet-shaped semiconductor device shown in FIG. 17, taken in the line 19—19 of FIG. 17.
Figure 20:
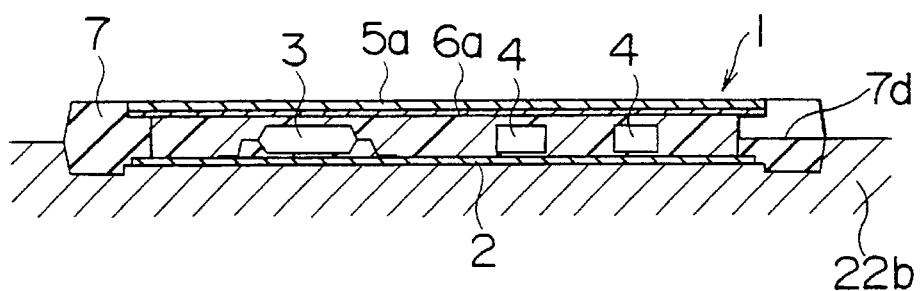
FIG. 20 is a cross-sectional view illustrating a production process of the thin sheet-shaped semiconductor device in accordance with the fifth embodiment of the present invention.
Figure 21:
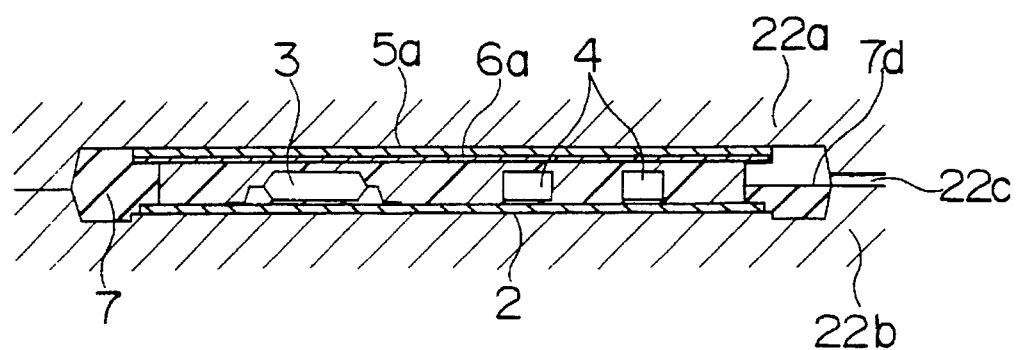
FIG. 21 is a cross-sectional view illustrating a production process of the thin sheet-shaped semiconductor device in accordance with the fifth embodiment of the present invention.

Fifth Embodiment:

FIGS. 17 and 18 are a plan view and a side view seen from the side of a gate, respectively, with respect to a thin sheet-shaped semiconductor device, for example an IC card, in accordance with a fifth embodiment of the present invention. FIGS. 19–21 are cross-sectional views illustrating processes for producing it. FIG. 19 is an enlarged cross-sectional view taken along the line 19—19 of FIG. 17. In this embodiment, a frame 7 has a groove 7d instead of the through-hole 7c passing across the frame 7 in the lateral direction. This groove is used to inject a resin to fill the inside with the resin and to mold the assembly into one body. As can be seen from the figures, an IC card in accordance with this fifth embodiment is generally the same as in the fourth embodiment except that the thin plate on the back surface of the circuit board 2 is not used in this embodiment. In the IC card 1 of this embodiment, the back surface of the circuit board 2 is exposed. Therefore, contacting tests after molding can be performed. In the final step of the process of producing the IC card 1, a designed sheet is stuck on the back surface of the circuit board 2. In accordance with the fifth embodiment, the thickness of the IC card 1 can be made thin, thus this embodiment can be preferably adopted to an IC card which is so thin that it is difficult to provide a through-hole 7c in the frame 7 as in FIG. 4.

As in the fourth embodiment, this fifth embodiment also uses a frame 7 made by means of injection molding with a liquid crystal polymer of type II, and preferably uses thin plates 5a and 5b made of a 0.25-mm thick PET sheet with a polyolefin based hot melt adhesive layer coatings on their surfaces. Furthermore, as for a resin used to mold the whole members into one body, a liquid crystal polymer of type II is preferably used as in the case of the frame.

In the above description of the first through fifth embodiments, in some embodiments an adhesive is applied to the surface sheet materials and in others one an adhesive is not used, and furthermore, in some embodiments, a foaming resin is used as a resin for molding the whole members into one body, and in another embodiment, a liquid crystal polymer is used. However, it may be possible to adopt different combinations depending on the type of molding resin, the adhesion properties of the surface sheet material, and their suitability. If an adhesive is applied to the surface of the surface sheet material, flexibility in making the combinations can be extremely expanded, so that it becomes possible to select a combination suitable for a specific thin sheet-shaped semiconductor device depending on the purposes and the environment in its use.

In the first through fifth embodiments described above, a foaming resin 10 or the like which can be cured at a low temperature has been used as the resin for molding the whole member into one body. This is because of the requirement that molding should be carried out at a low enough temperature when a battery is included in an IC card. Therefore, as a matter of course, if there is no limitations as to the temperature associated with functional components such as a battery to be installed, the resin may be cured at a higher temperature. Furthermore, a liquid crystal polymer has been used as a resin for unitary molding and also as a material for the frame 7. However, this is only one of options available for the embodiments, which has been decided based on the combination of the specific functional components and circuit board 2 to be embedded. The invention is not limited to that, and other resins may also be used for molding the assembly into one body.

In the first through fifth embodiments described above, as for the thin plate 5, a transparent PVC sheet with back side printing or a printed PET sheet has been used. The present invention has an advantage that it is possible to select an arbitrary material for the thin plate 5 from various materials such as a thin plate with a granulated surface and sheets of other materials depending on the type of molding resin and the adhesive coating on the surface sheet material.

Figure 22:
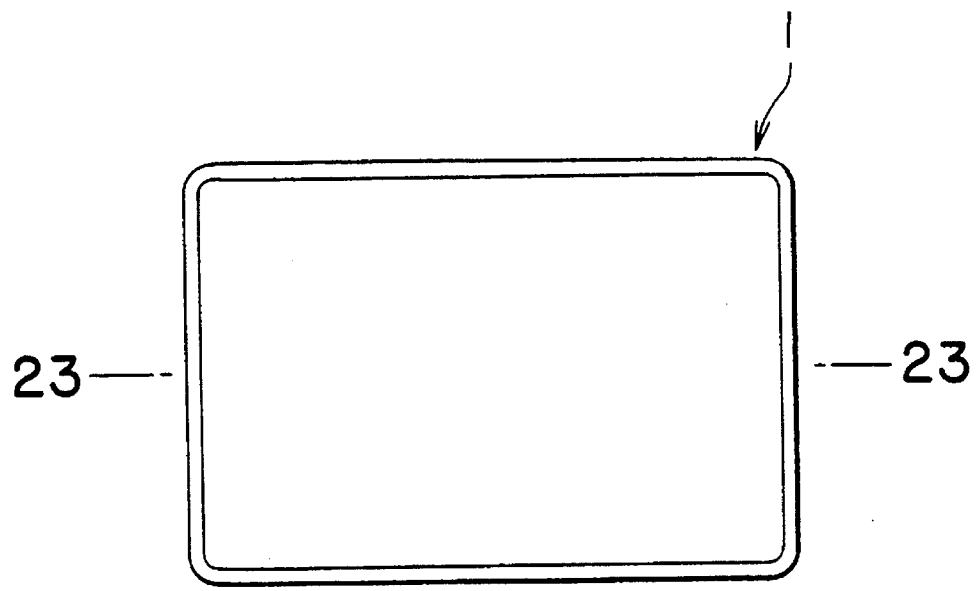
FIG. 22 is a plan view of a thin sheet-shaped S semiconductor device in accordance with a sixth embodiment of the present invention.
Figure 23:
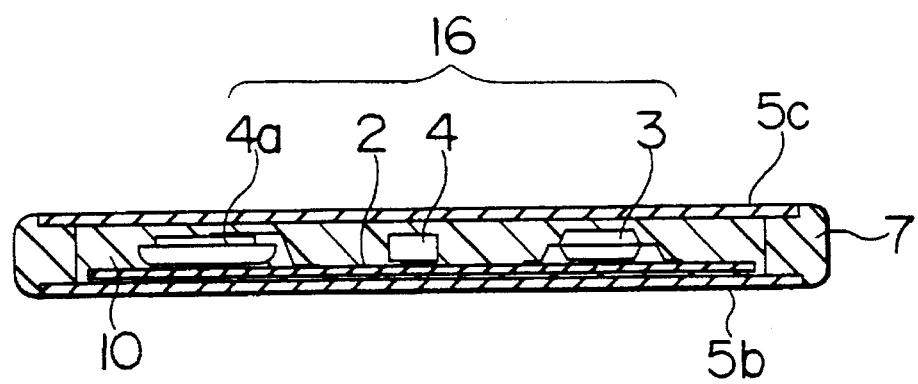
FIG. 23 is an enlarged cross-sectional view of the thin sheet-shaped semiconductor device shown in FIG. 22, taken in the line 23—23 of FIG. 22.

Sixth Embodiment:

FIG. 22 is a plan view showing a thin sheet-shaped semiconductor device, such as an IC card, in accordance with a sixth embodiment of the present invention. FIG. 23 is an enlarged cross-sectional view taken in the line 23—2B of FIG. 22.

In these figures, an IC card 1 is surrounded by a frame 7 forming side portions of the IC card 1 and by a thin plates 5a and 5b acting as a surface material. Inside the IC card 1, there is provided a module 16 in which electronic components such as an IC 3, a battery 4a, and other components 4 are installed. The term "electronic component" is herein used to denote a functional component, for example, an IC 3, and further to denote a resistor, capacitor, battery used as a power supply, and interconnection circuit (not shown). A foaming resin 10 inside the IC card 1 covers the electronic components and the like. In this embodiment, preferably, a three-solution type intermediate temperature setting epoxy resin may be used.

Figure 24:
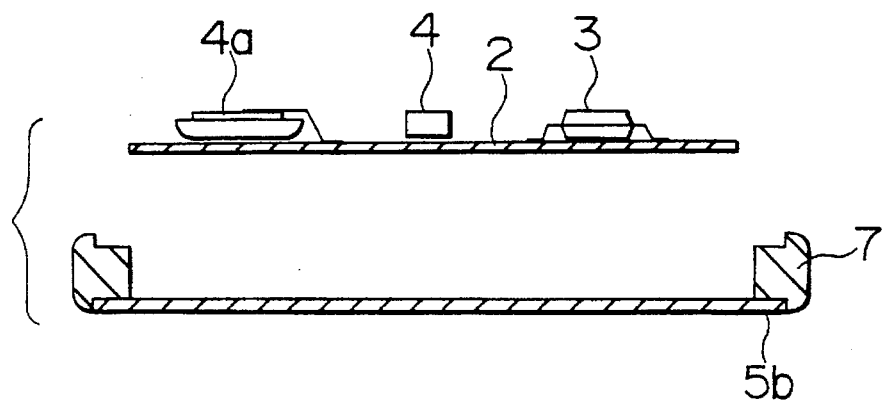
FIG. 24 is a cross-sectional view illustrating a production process of the thin sheet-shaped semiconductor device in accordance with the sixth embodiment of the present invention.
Figure 25:
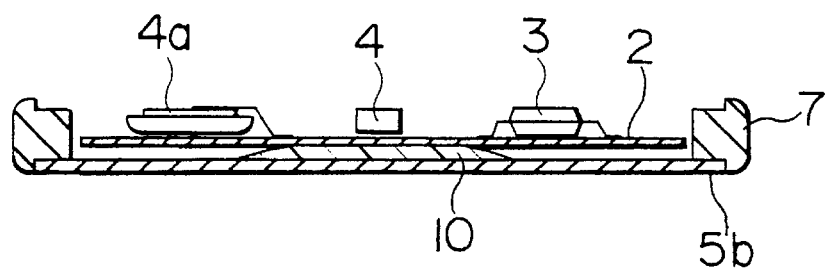
FIG. 25 is a cross-sectional view illustrating a production process of the thin sheet-shaped semiconductor device in accordance with the sixth embodiment of the present invention.
Figure 26:
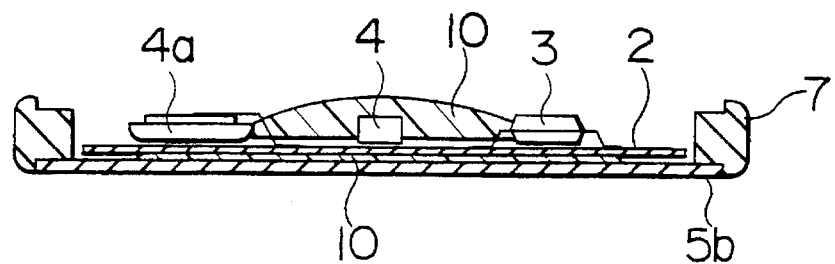
FIG. 26 is a cross-sectional view illustrating a production process of the thin sheet-shaped semiconductor device in accordance with the sixth embodiment of the present invention.
Figure 27:
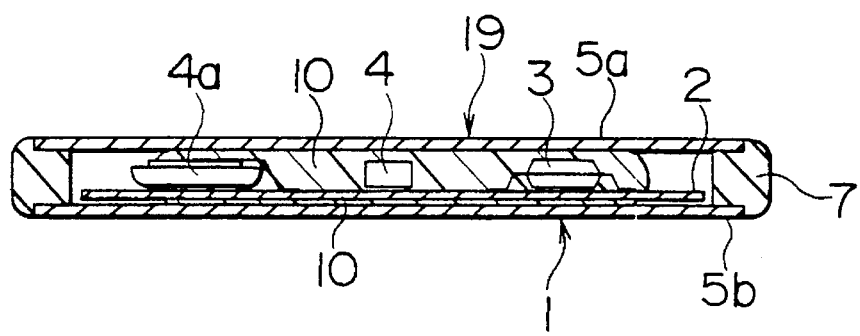
FIG. 27 is a cross-sectional view illustrating a production process of the thin sheet-shaped semiconductor device in accordance with the sixth embodiment of the present invention.
Figure 28:
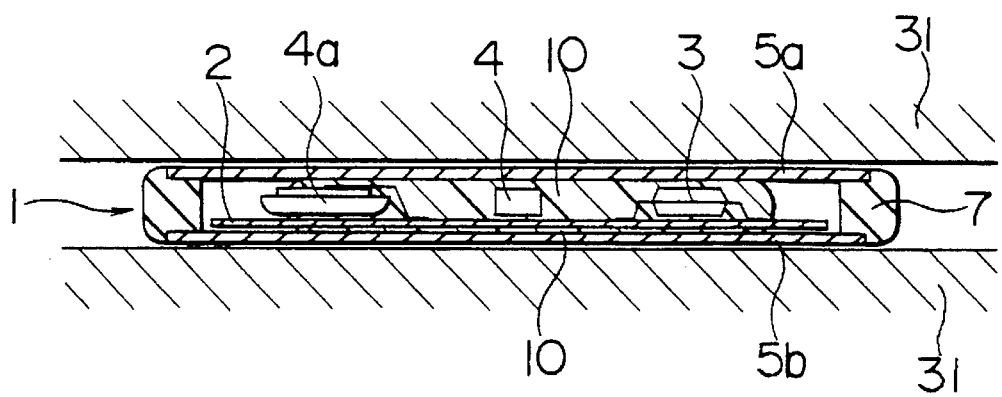
FIG. 28 is a cross-sectional view illustrating a production process of the thin sheet-shaped semiconductor device in accordance with the sixth embodiment of the present invention.

An IC card 1 having such a configuration described above may be produced according to a procedure shown in FIGS. 24–28. These FIGS. 24–28 are a cross-sectional side view schematically representing the IC card 1. First, as shown in FIG. 24, a circuit board 2 comprising a semiconductor module 16, on which an IC 3, a component 4, and a battery are mounted, is fabricated. A frame 7 is made by injection-molding using, for example, an ABC resin. Then, a thin plate 5b made of polyester resin is bonded to the frame 7. Furthermore, as shown in FIG. 25, half the predetermined amount of a foaming resin 10, for example, a foaming epoxy resin, is injected onto the central portion of the thin plate 5b shown in FIG. 24, and the circuit board 2 is put on it. Then, as shown in FIG. 26, the remaining amount of the foaming resin 10 is injected onto the central portion of the circuit board 2. After that, the other thin plate 5a is put on them so as to extend the foaming resin 10 such that the thin plate 5a is finally bonded to the frame 7 in the form as shown in FIG. 27. Then, as shown in FIG. 28, each side of the thin plate 5a and 5b is fixed with a curing fixture 31, and heated to foam and expand the foaming resin 10 such that the inside of the IC card 1 is filled with the foaming resin. In this state, the foaming resin is cured.

In the above process, the resin capable of foaming can be prepared by mixing a main agent, curing agent, and foaming agent. In this sixth embodiment, a foaming epoxy resin is preferably used which becomes a closed-cell foamed resin including voids of about 50% of the total volume after cured by heating it at 50° C. for one hour.

Preferable viscosity of the foaming epoxy resin is about 50,000 CP (centipoise) after the curing agent and foaming agent are added, which exhibits slight thixotropy. This permits the resin to gradually extend after it is injected in the central portion of the frame 7. Thus, it becomes possible to make the circuit board 2 float in the resin. Therefore, even in the situation in which the thin plate 5a is attached to the frame 7 and the case 19 has been completed, the resin can extend from the central portion toward the peripheral portion. If the resin is heated in this situation, foaming starts and volume expansion occurs in the foaming resin 10. As a result the foaming resin 10 further extends toward the peripheral portion.

Figure 29:
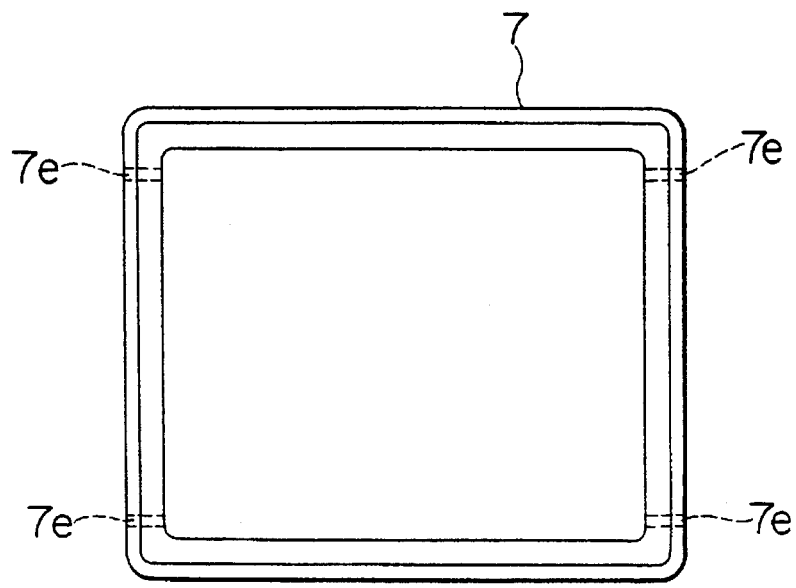
FIG. 29 is a plan view of a modified form of thin sheet-shaped semiconductor device in accordance with the sixth embodiment of the present invention.
Figure 30:
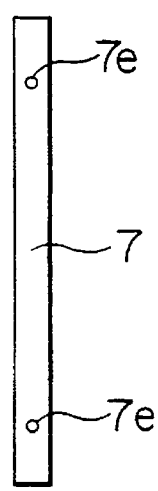
FIG. 30 is a side view of the thin sheet-shaped semiconductor device of FIG. 29.

In this way, the foaming resin 10 gradually fills in the case 19 from the central portion to the peripheral portion. In this sixth embodiment, as shown in FIG. 29, there are provided through-holes 7e passing through the frame at four locations near the corner on both sides, opposite to each other. As a result, the air inside the case 19 is pushed out by the expanding foaming resin 10, and the foaming resin 10 smoothly fills the inside. After the inside of the case 19 is fully filled with the foaming resin 10, the excess resin is exhausted through the through-holes 73. The resistance which the foaming resin 10 meets when passing through the through-holes 7e is larger than that which the foaming resin 10 meets when extending within the case 19. Therefore, even if a difference occurs in timing when the foaming resin 10 reaches each of four corner portions, the high resistance of the through-hole permits the foaming resin 10 to fill the remaining corner portions before escaping through the through-holes. In this way, the corner portions can be filled with the foaming resin 10 without fail. In this sixth embodiment, a preferable amount of the resin 10 before forming to be put in the case 19 is such an amount that would expand to a volume having a 10% excess.

Figure 31:
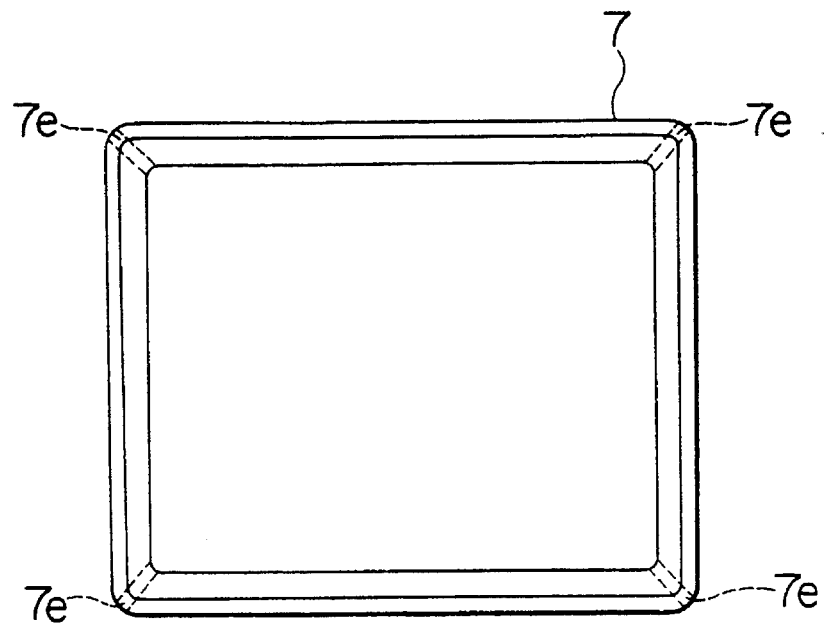
FIG. 31 is a plan view of a thin sheet-shaped semiconductor device in accordance with a seventh embodiment of the present invention.
Figure 32:
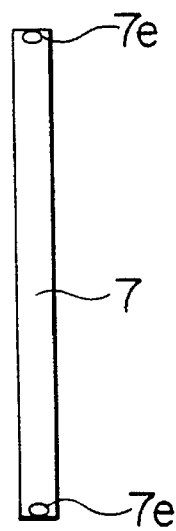
FIG. 32 is a side view of the thin sheet-shaped semiconductor device of FIG. 31.

Seventh Embodiment:

FIGS. 31 and 32 are a plan view and a side view, respectively, showing a frame 7 composing a case 19 of a thin sheet-shaped semiconductor device, such as an IC card, in accordance with a seventh embodiment of the present invention. As shown in these figures, through-holes 7e passing through the frame 7 are provided at each of four corners of the frame 7. This frame 7 is filled with a foaming resin 10 such as a foaming epoxy resin to obtain a complete IC card 1 in the same manner as in the sixth embodiment. Through these through-holes 7e provided at the corners, the excess of the foaming resin 10 and also the air in the case 19 are exhausted by the expansion of foaming resin 10. Thus, it is possible to achieve effective filling of the foaming resin 10.

Figure 33:
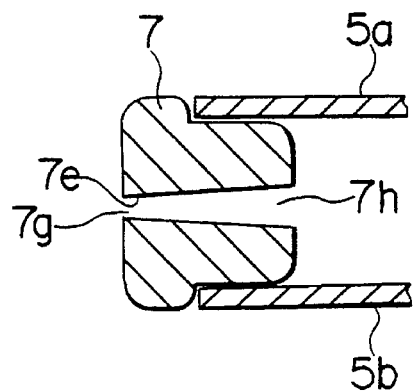
FIG. 33 is an enlarged fragmentary cross-sectional view of a thin sheet-shaped semiconductor device in accordance with an eighth embodiment of the present invention.

Eighth Embodiment:

FIG. 33 is an enlarged fragmentary cross-sectional view of a thin sheet-shaped semiconductor device such as an IC card in accordance with an eighth embodiment of the present invention, showing a through-hole 7e formed in a frame 7 of a case 19 consisting of the frame 7 and a thin plates 5a and 5b. This through-hole 7e is formed in such a manner that the size of the inside aperture 7h is larger than that of the outside aperture 7g. Filling of a foaming resin 10 due to its expansion occurs toward the through-hole 7e as described in the sixth embodiment. Because the frame 7 and the thin plates 5a and 5b are bonded to each other, the air existing in the case 19 is exhausted through the aperture 7g. In this air exhausting process, the large size of the aperture 7h of the through-hole 7e permits the foaming resin 10 to smoothly push out air without leaving air behind inside the frame 7. Thus, it becomes possible to achieve efficient filling of the foaming resin.

On the other hand, the aperture 7g of the through-hole 7e provided in the frame 7 is exposed on the side of the IC card 1. From the viewpoint of appearance, the smaller exposed area is more preferable. This requirement can be achieved by making the outside aperture 7g small enough. That is to say, the size of the inside aperture 7h is made large so as to permit the foaming resin 10 to easily exhaust and replace air and thus so as to permit the foaming resin 10 to fully fill the inside of the IC card 1 without leaving air behind. At the same time, the size of the outside aperture 7g is made small so as to improve the appearance of the IC card 1.

Figure 34:
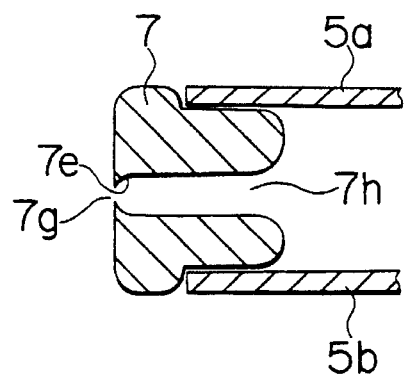
FIG. 34 is an enlarged fragmentary cross-sectional view of a thin sheet-shaped semiconductor device in accordance with a ninth embodiment of the present invention.
Figure 35:
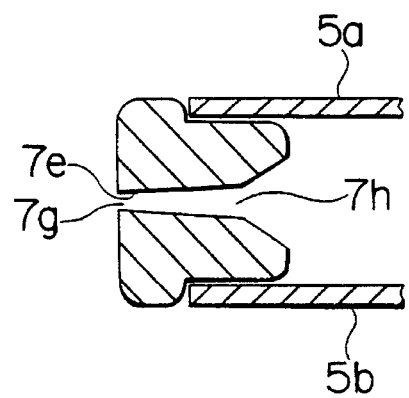
FIG. 35 is an enlarged fragmentary cross-sectional view of a modified form of thin sheet-shaped semiconductor device in accordance with the ninth embodiment of the present invention.

Ninth Embodiment:

FIGS. 34 and 35 are enlarged fragmentary cross-sectional views of a through-hole 7e of a thin sheet-shaped semiconductor device such as an IC card in accordance with a ninth embodiment of the present invention. As shown in these figures, the size of the inside aperture 7h of a through-hole 7e is made large and the size of the outside aperture 7g is made small, as in the case of the eighth embodiment. As shown in FIG. 34, the aperture 7g is configured by narrowing the peripheral end portion of the frame 7, and inside aperture 7h has an expanding taper like a horn. FIG. 35 shows an alternative form of the inside aperture 7g of the frame 7, which has a linearly expanding taper. With these apertures, it is possible to obtain similar effects to those as in the eighth embodiment. An IC card 1 may be produced in the same manner as in the sixth embodiment. The aperture 7h may be, alternatively, configured in such a manner that the cross-section of the aperture 7h expands to an extremely large degree along the frame to obtain similar effects to the above, which will not be described in more detail.

Figure 36:
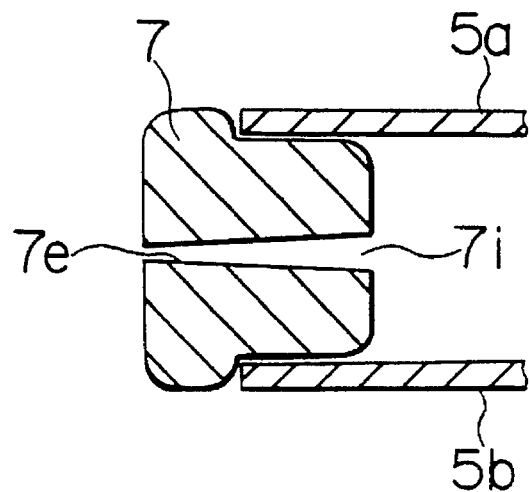
FIG. 36 is an enlarged fragmentary cross-sectional view of a thin sheet-shaped semiconductor device in accordance with a tenth embodiment of the present invention.
Figure 37:
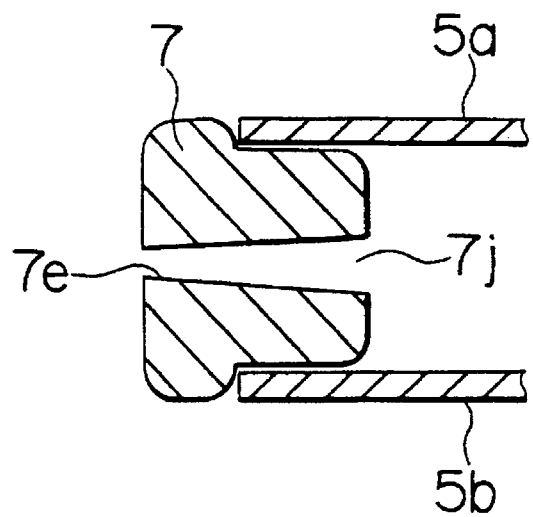
FIG. 37 is an enlarged fragmentary cross-sectional view of a modified form of thin sheet-shaped semiconductor device in accordance with the tenth embodiment of the present invention.
Figure 38:
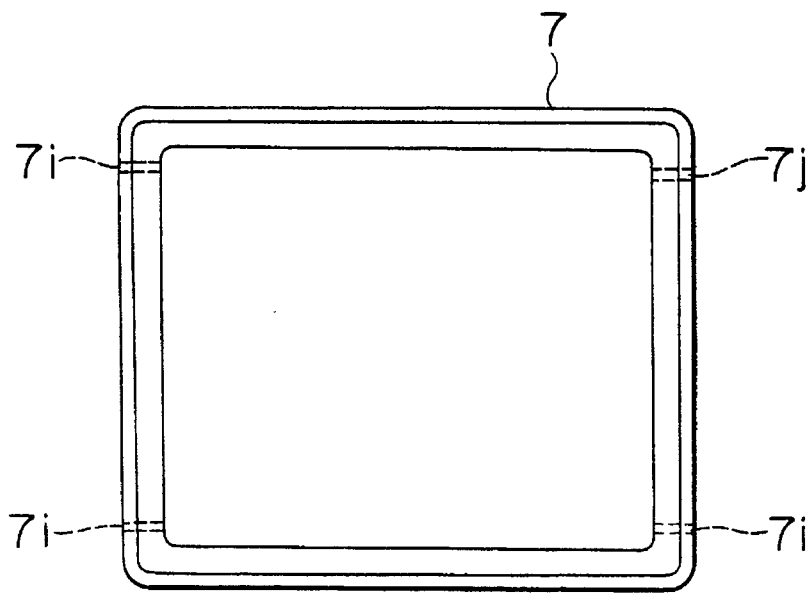
FIG. 38 is a plan view of the thin sheet-shaped semiconductor device in accordance with the tenth embodiment of the present invention.

Tenth Embodiment:

FIGS. 36 and 37 are an enlarged fragmentary cross-sectional views of a through-hole 7e of an IC card 1 in accordance with a tenth embodiment of the present invention. FIG. 38 is a plan view of a frame 7. As shown in these figures, in this embodiment, there are provided two different sizes of through-holes: a large sized through-hole 7j and small sized through-holes 7i. The large sized through-hole 7j is provided at one location, while the small sized through-holes 7i are provided at three different locations.

An IC card 1 provided with this type of frame 7 may be produced in a similar way to that described in the sixth embodiment. A foaming epoxy resin used as a foaming resin 10 is filled in a case 19 consisting of a frame 7 and thin plates 5a and 5b, and foaming makes it expand, approaching the through-holes 7i and 7j at four corners. However, because the sizes of three through-holes 7i are small, the high viscosity of the foaming resin 10 prevents the foaming resin 10 from easily escaping through these through-holes 7i while air can be easily exhausted. On the other hand, because the remaining through-hole 7j has a large size, the foaming resin 10 can easily pass through this through-hole. Therefore, almost all excess of foaming resin 10 is exhausted through this through-hole 7j. As a result, a specific through-hole 7j can be used to intensively exhaust the excess foaming resin 10 without failure in filling the foaming resin 10. This leads to easy control of production and it also becomes possible to easily prevent the production equipment or the like from being made dirty.

Figure 39:
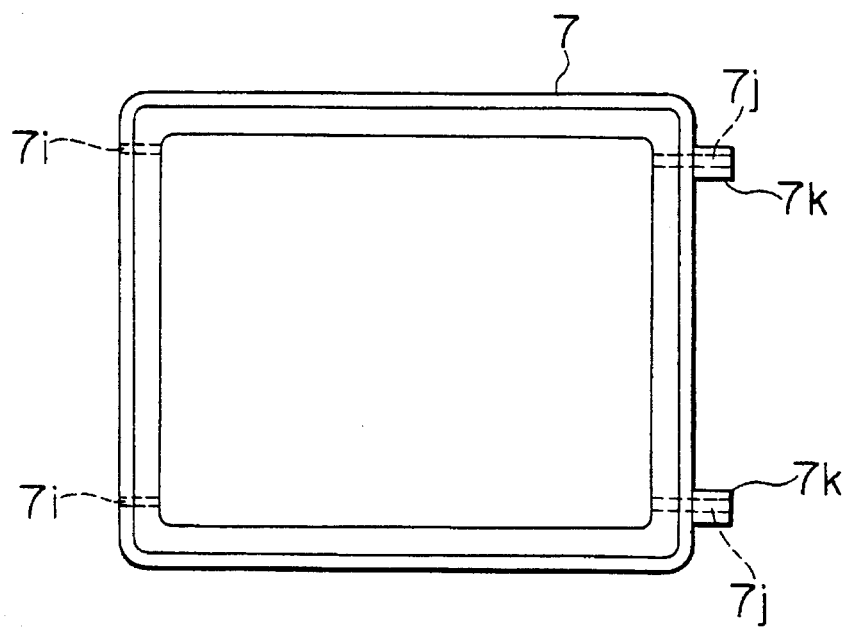
FIG. 39 is a plan view of a thin sheet-shaped semiconductor device in accordance with an eleventh embodiment of the present invention.
Figure 40:
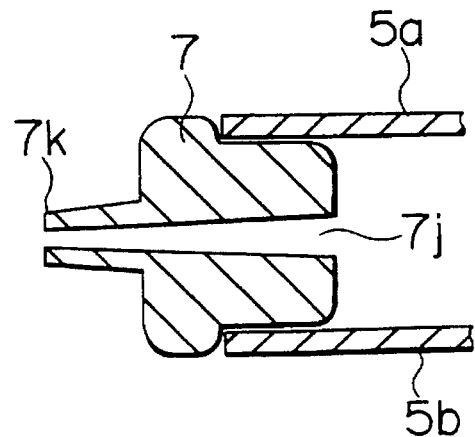
FIG. 40 is an enlarged fragmentary cross-sectional view of the thin sheet-shaped semiconductor device of FIG. 39.

Eleventh Embodiment:

FIG. 39 is a plan view of a frame 7 of a thin sheet-shaped semiconductor device such as an IC card 1 in accordance with a eleventh embodiment of the present invention. FIG. 40 is an enlarged fragmentary cross-sectional view showing a through-hole 7j of the frame 7 shown in FIG. 39. In this embodiment, as shown in FIG. 39, there are provided protrusions 7k protruding outward from the frame 7 so as to extend the through-holes 7j. On the other hand, through-holes 7i provided on the opposite side have a size which is small enough to prevent the foaming resin 10 from easily escaping and which, at the same time, is large enough for air to easily leak. An IC card 1 with the frame 7 may be produced in the same manner as in the sixth embodiment.

The sizes of the through-holes 7j having the protrusion 7k protruding from the frame 7 are larger than the sizes of the through-holes 7i. Therefore, the excess foaming resin 10 can be exhausted intensively through these protrusions 7k without making the body of the IC card 1 or production equipment dirty. Furthermore, after the foaming resin 10 has been cured, only by cutting the protrusions 7k along the frame 7 to remove them, a complete IC card 1 can be obtained.

Figure 41:
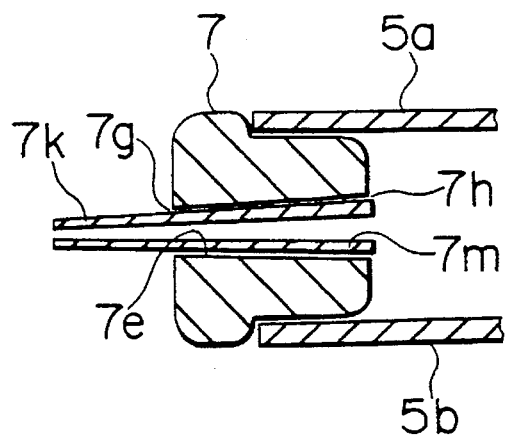
FIG. 41 is an enlarged fragmentary cross-sectional view of a thin sheet-shaped semiconductor device in accordance with a twelfth embodiment of the present invention.
Figure 42:
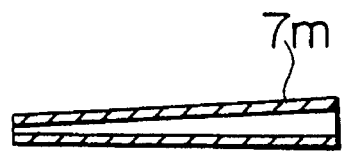
FIG. 42 is a cross-sectional side view of the tube shown in FIG. 41.
Figure 43:
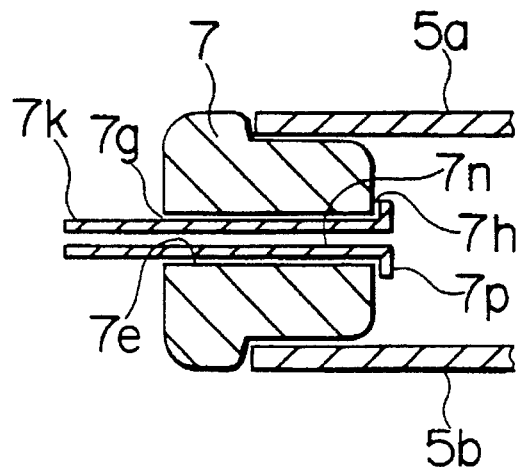
FIG. 43 is an enlarged fragmentary cross-sectional view of a modified form of thin sheet-shaped semiconductor device in accordance with the twelfth embodiment of the present invention.
Figure 44:
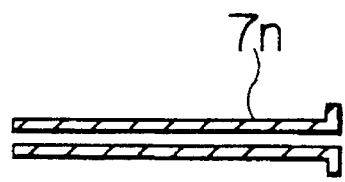
FIG. 44 is a cross-sectional side view of the tube shown in FIG. 43.

Twelfth Embodiment:

FIGS. 41 and 43 are enlarged fragmentary cross-sectional views showing a through-hole 7e of a frame 7 of thin sheet-shaped semiconductor device, such as an IC card, in accordance with a twelfth embodiment of the present invention. In this embodiment, as shown in FIG. 41, a tube 7m is fitted into the through-hole 7e such that the tube 7m touches the through-hole 7e internally so as to form a protrusion 7k similar to the eleventh embodiment. The through-hole 7e into which the tube 7m is to be fitted is configured such that the inside aperture 7h which is to meet the foaming resin 10 has a large size and the outside aperture 7g has a small size. The tube 7m has a shape such that when the tube 7m is fitted into the through-hole 7e the tube may fully touch the through-hole 7e internally. This can prevent removal of the tube 7m due to the internal pressure introduced by expansion of the foaming resin 10. Thus, as in the eleventh embodiment, it is possible to intensively exhaust the foaming resin 10 through the protrusion 7k comprising the tube 7m.

An example shown in FIG. 43 is similar to that as in FIG. 41 with exception that a tube 7n has a nearly straight shape and the tube 7n has a flange 7p at the side located inside the frame 7 to prevent the tube from being removed. This flange 7p not only prevents the tube 7m from being removed, but also prevents the foaming resin 10 from leaking through the boundary between the tube 7n and the through-hole 7e.

Figure 45:
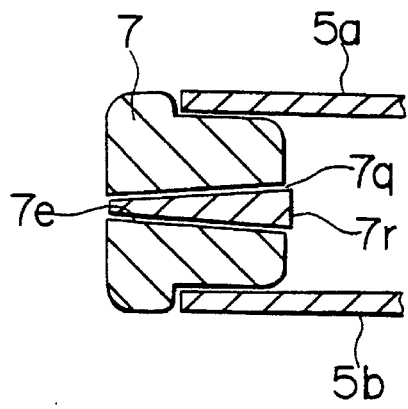
FIG. 45 is an enlarged fragmentary cross-sectional view of a thin sheet-shaped semiconductor device in accordance with a thirteenth embodiment of the present invention.
Figure 46:
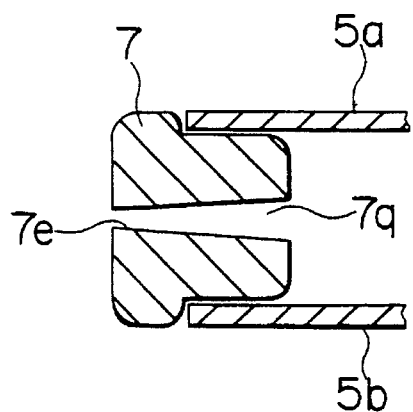
FIG. 46 is an enlarged fragmentary cross-sectional view of a modified form of thin sheet-shaped semiconductor device in accordance with the thirteenth embodiment of the present invention.
Figure 47:
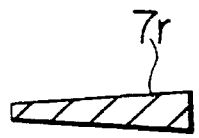
FIG. 47 is a cross-sectional side view of the stopper shown in FIG. 43.

Thirteenth Embodiment:

FIG. 45 is an enlarged fragmentary cross-sectional view of a through-hole 7e of a frame 7 of a thin sheet-shaped semiconductor device such as an IC card 1 in accordance with a thirteenth embodiment of the present invention. As shown in FIG. 45, the aperture 7q of the through-hole 7e has a large size at the inner side of the frame 7 and a small size at the outer side. This aperture 7q is blocked with a stopper 7r which touches the through-hole 7e internally. Of those through-holes 7e provided in the frame 7, three through-holes are configured in this way. FIG. 46 shows the aperture 7q. The stopper shown in FIG. 47 is inserted into the through-hole 7e so as to block the through-hole 7e. The inner surface of the through-hole 7e and the surface of the stopper 7r are rough so that the foaming resin 10 having high viscosity cannot pass while air can pass.

An IC card according to this embodiment may be produced in a similar way to that as in the sixth embodiment. However, in this embodiment, of four through-holes provided in the frame 7, three through-holes 7e are blocked with the stoppers 7r. As a result of this arrangement, when expansion of the foaming resin 10 occurs due to its foaming, air can leak through each through-hole, while, when the foaming resin 10 reaches the boundary between the through-hole 7e and the stopper 7r, the foaming resin 10 cannot pass through the through-hole 7e because of its high viscosity and because of interfacial tension. Thus, the excess foaming resin 10 is intensively exhausted through the through-hole which is not blocked with a stopper 7r.

As described above, except for one through-hole, all through-holes 7e are blocked with a stopper 7r, so that air is exhausted through each through-hole, while the excess foaming resin 10 is exhausted through a specific through-hole which is not blocked with a stopper 7r. This makes it easy to exhaust an excess foaming resin during the production process of a IC card 1.

Fourteenth Embodiment:

This fourteenth embodiment is the same as the thirteenth embodiment in that, of four through-holes provided in a frame 7, three through-holes are blocked with a stopper 7r. However, in this fourteenth embodiment, the remaining through-hole is configured such that it has a protrusion 7k composed of a tube 7p as in the case of the twelfth embodiment shown in FIG. 43. An excess amount of the foaming resin 10 is exhausted only through this tube 7p, to easily exhaust the excess foaming resin during production of an IC card 1, as in the case of the thirteenth embodiment.

Figure 48:
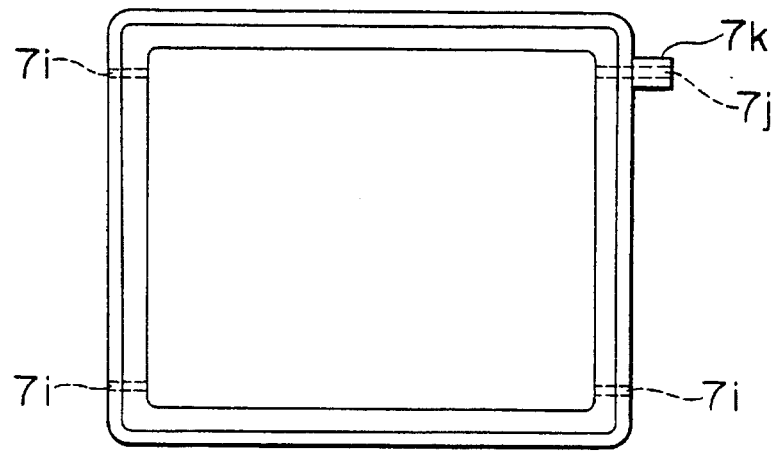
FIG. 48 is a plan view of a thin sheet-shaped semiconductor device in accordance with a fifteenth embodiment of the present invention.
Figure 49:
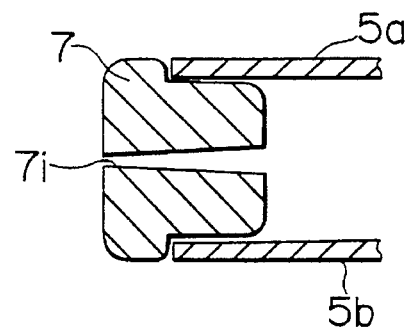
FIG. 49 is an enlarged fragmentary cross-sectional view of the thin sheet-shaped semiconductor device of FIG. 48.
Figure 50:
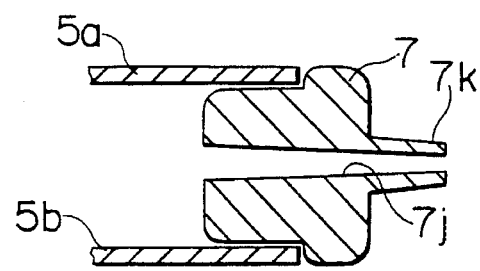
FIG. 50 is an enlarged fragmentary cross-sectional view of a modified form of thin sheet-shaped semiconductor device in accordance with the fifteenth embodiment of the present invention.
Figure 51:
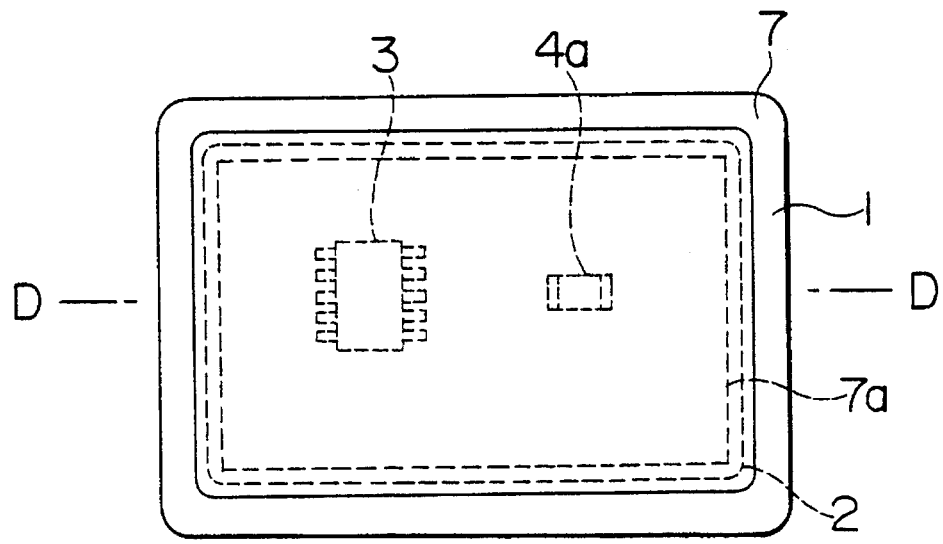
FIG. 51 is a plan view of a conventional thin sheet-shaped semiconductor device.
Figure 52:
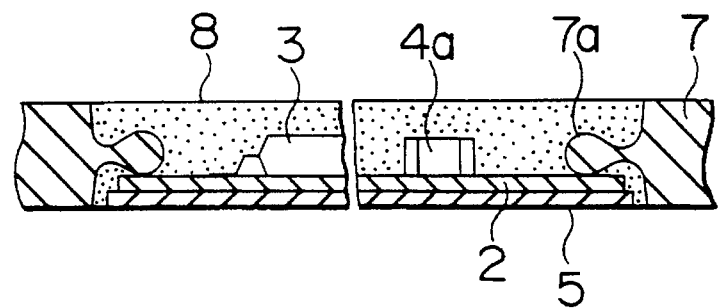
FIG. 52 is a cross-sectional side view of the thin sheet-shaped semiconductor device of FIG. 51.
Figure 53:
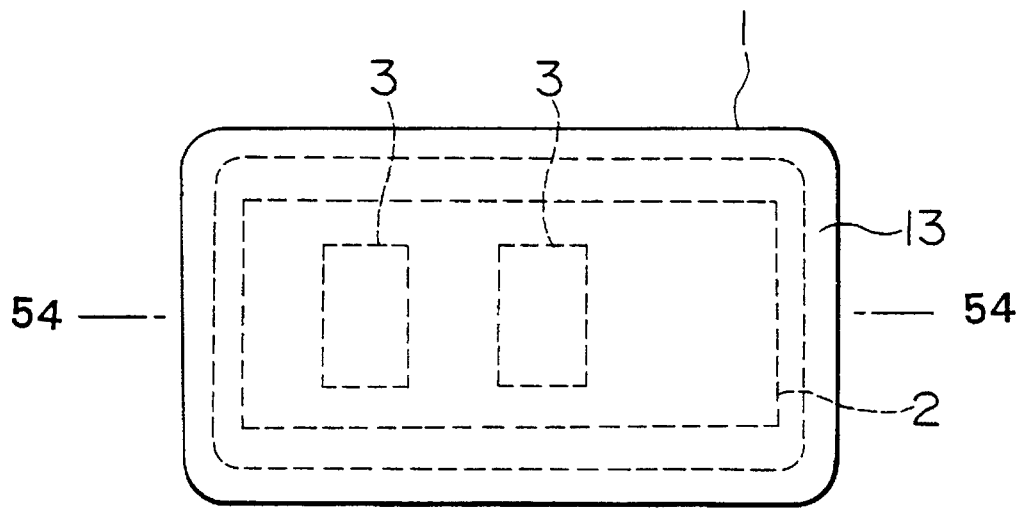
FIG. 53 is a plan view showing another conventional thin sheet-shaped semiconductor device.
Figure 54:
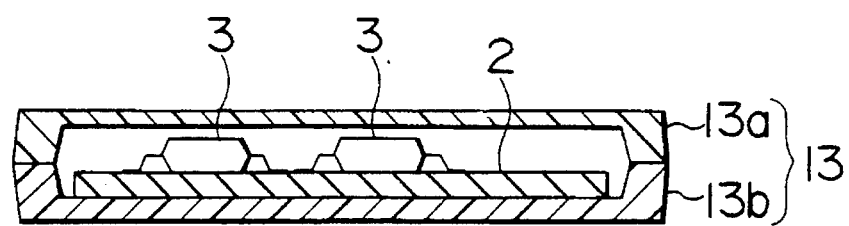
FIG. 54 is a cross-sectional side view of the thin sheet-shaped semiconductor device of FIG. 53.
Figure 55:
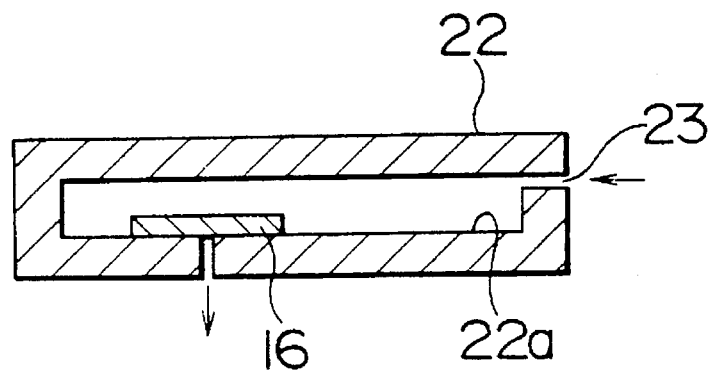
FIG. 55 is a schematic diagram showing a production process of further another conventional thin sheet-shaped semiconductor device.
Figure 56:
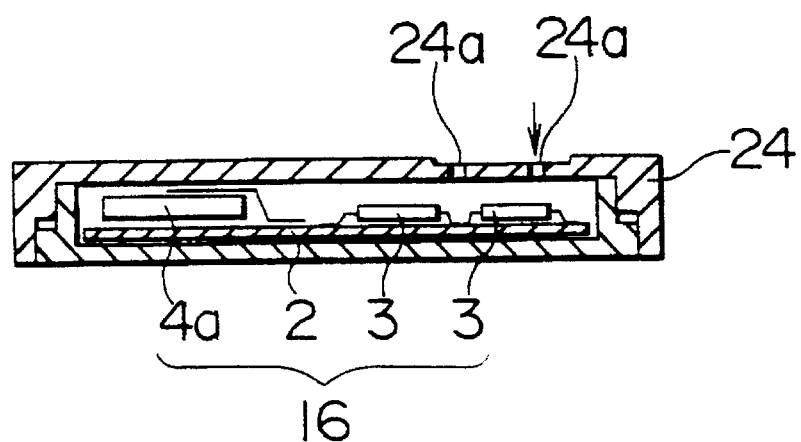
FIG. 56 is a cross-sectional side view of still another conventional thin sheet-shaped semiconductor device.

Fifteenth Embodiment:

FIG. 48 is a plan view of a frame 7 of a thin sheet-shaped semiconductor device such as an IC card in accordance with a fifteenth embodiment of the present invention. FIGS. 49 and 50 are enlarged fragmentary cross-sectional view showing a through-hole of the frame 7. As shown in these figures, four through-holes are formed in the frame 7 in such a manner that three through-holes 7i have a small size so that air can be easily exhausted while a foaming resin 10 cannot easily pass through these through-holes 7i. The remaining through-hole 7j has a protrusion 7k protruding outward from the frame 7. With this arrangement, an excess amount of the foaming resin 10 is intensively exhausted through this through-hole 7k.

In the sixth through fifteenth embodiments described above, when a foaming resin is foamed, the inside of an IC card 1 is fully filled with the foaming resin 10 and an excess amount of the foaming resin is exhausted through a through-hole. In this state, the foaming resin is hardened and an IC card 1 is obtained. Then, the excess foaming resin 10 exhausted through the through-hole is removed from the boundary along a surface of a frame 7 or it is removed by cutting off the protrusion 7k at its root. Thus, the production of an IC card 1 is completed.

In accordance with the present invention, as opposed to the case where printing is carried out onto a molded card, printing need not be performed individually, one by one. Instead, it is possible to efficiently print a large amount of information on a sheet of surface material. Moreover, if printed sheets are prepared, then it becomes possible to easily produce different design cards having the same contents.

A sheet on which printing has been performed in advance is prepared, and is incorporated within a card when the card is integrally molded. Therefore, as opposed to the case where printing is performed directly on a molded surface, it is not necessary to consider the flatness of a printing surface. In addition, there is no possibility that swelling will occur due to gas bubbles contained in an adhesive layer, as may occur in the case where a design sheet is stuck to a card surface after molding is performed. In particular, it is possible to add a design to a transparent sheet by means of back-side printing so as to realize an integrally molded card with a design sheet whose design surface is incorporated within the card. As a result, it becomes possible to obtain a card which is excellent in appearance and which is insensitive to scratching. Moreover, it is also possible to make a thin plate serving as a surface material strongly bonded via an adhesive (or with no adhesive) to a molding resin filling a card to mold the assembly into an integral form. Therefore, a material may be selected which is suitable for use as a surface material of a semiconductor device depending on requirements such as low temperature resistance, mechanical shock resistance, easy portability, and so on. As can be seen from the above description of the embodiments, although the inside of an IC card is filled with an foaming material, problems in design can be avoided by using a sheet material having excellent printability.

Furthermore, during a molding process, processing may also be performed on a printed surface of a material selected based on the requirement for use. Molding is carried out in a state where a circuit board and a surface material are fitted to a frame and they are securely fixed by means of clamping to a mold. Thus the circuit board or the like is not moved by the flow of a resin during injection molding. When a pressure-sensitive or heat-sensitive adhesive coats a surface material to be fitted to a frame, an arbitrary combination can be achieved between the type of a molding resin and the type of a sheet material if an adhesive is suitably selected depending on the types of the molding resin and the sheet material. As for an adhesive, an adhesive in a form of sheet may be transferred to a surface material, or alternatively, a surface material may be directly coated with an adhesive to form an adhesive layer. The type of adhesive and a method for forming an adhesive layer may be selected based on molding temperature of a molding resin to be used for integral molding. When a pressure-sensitive adhesive is formed on a surface material, the surface material can be bonded to a frame to obtain good workability. Furthermore, because the surface having a pressure-sensitive adhesive layer is tack-free, easy handling is possible. When a thermoplastic resin is used as a molding resin for molding a frame and a card surface material into one body, in the case of communication type card in which a plastic sheet is used as a surface material, it is possible to easily achieve good matching of expansion coefficients between the surface material and the molding resin, thus it is possible to produce a card which is flexible and tough at the same time.

When a foaming resin is used as a molding resin for molding a frame and a card surface material into one body, it is possible to produce a card having high resistance to various kinds of mechanical stress in particular, a mechanical shock. Besides, it is possible to produce a light card which will not give a person a heavy feeling when he/she carries it. By adjusting the foaming density, elastic modulus and the like of the foaming resin, it is possible to produce a card which can meet broader requirements for use. By modifying the shape of through-holes and the combination of their shapes depending on the viscosity of a foaming resin as not foamed yet or depending on the combination between the type of a module and the type of a case the foaming resin is to fill, it is possible to optimize the combination. Furthermore, because the pressure introduced during a molding process is low, it is possible to use a simple mold for fixing the members, and it is also possible to adopt a low curing temperature. Thus it becomes possible to incorporate a battery, which does not have strong resistance to heat and pressure, within a integrally molded card. In addition, because unitary molding is performed after a circuit board having functional components is put into a case, it is possible to easily produce various cards by using the same processes and the same mold regardless of the internal configuration as long as the case is the same. Thus it is also possible to produce a thin semiconductor device by simple processes without using complicated assembly processes. This leads to great improvement in productivity.

What is claimed is:

1. A method for producing an IC card comprising the steps of:

filling a confined space with a mixture including a foaming resin, said space being confined by a frame having cut-out portions on inner edges and at least one through-hole passing through said frame in the lateral direction between the inside and the outside of said frame, a circuit board on which functional components are mounted and having edges fitted to one of said cut-out portions of said frame so that the surface of said circuit board on which functional components are mounted faces inward, said frame and said circuit board forming a substantially flat outer surface, and a thin plate having edges fitted to another of said cut-out portions of said frame with said thin plate opposing said circuit board, said frame and said thin plate forming a substantially flat outer surface;

foaming said mixture at a predetermined temperature for predetermined time, thus filling the confined space with foamed resin, and thus making said foamed resin a structural member having mechanical strength, molding said frame, said circuit board, and said thin plate into one body; and removing excess foamed resin outside of said frame at the through-hole in said frame.

* * * * *